United States Patent [19]

Chim et al.

[11] Patent Number: 5,724,131
[45] Date of Patent: Mar. 3, 1998

[54] INTEGRATED EMISSION MICROSCOPE FOR PANCHROMATIC IMAGING, CONTINUOUS WAVELENGTH SPECTROSCOPY AND SELECTIVE AREA SPECTROSCOPIC MAPPING

[75] Inventors: Wai Kin Chim; Daniel Siu Hung Chan; Jacob Chee Hong Phang; Jing Mei Tao; Yong Yu Liu, all of Singapore, Singapore

[73] Assignee: The National University of Singapore, Singapore, Singapore

[21] Appl. No.: 511,351

[22] Filed: Aug. 4, 1995

Related U.S. Application Data

[63] Continuation-in-part of Ser. No. 490,352, Jun. 14, 1995, Pat. No. 5,569,920.

[51] Int. Cl.[6] ................................................. G01N 21/71
[52] U.S. Cl. ................................. 356/237; 250/341.6
[58] Field of Search .......................... 356/237, 218, 356/219, 225; 324/501, 765, 768, 769; 250/341.6

[56] References Cited

U.S. PATENT DOCUMENTS

| | | | |
|---|---|---|---|
| 3,790,781 | 2/1974 | Horl et al. | 250/310 |
| 4,680,635 | 7/1987 | Khurana | 358/211 |
| 4,755,874 | 7/1988 | Esrig et al. | 358/106 |
| 4,811,090 | 3/1989 | Khurana | 358/93 |
| 4,900,932 | 2/1990 | Schafer et al. | 250/397 |
| 4,929,041 | 5/1990 | Vahala et al. | 350/96.1 |
| 5,010,253 | 4/1991 | Braglia et al. | 250/399 |
| 5,075,552 | 12/1991 | McClelland et al. | 250/341.6 |
| 5,264,704 | 11/1993 | Phang et al. | 250/347 |
| 5,504,431 | 4/1996 | Maeda et al. | 324/501 |

FOREIGN PATENT DOCUMENTS

| | | | |
|---|---|---|---|
| 0 510 887 A2 | 4/1992 | European Pat. Off. | 31/308 |
| 0 510887 | 10/1992 | European Pat. Off. | |

OTHER PUBLICATIONS

Steyn et al "An Efficient Spectroscopic Detection System for Cathodoluminescence Mode Scanning Electron Microscopy (SEM)" Journal of Microscopy, vol. 1.07 P12, Jul. 1976, pp. 107–128.

Kölzer, J. et al. "Quantitative Emission Microscopy", J. Appl. Phys. 71(11) 1 Jun. 1992, pp. R23–R41.

*Primary Examiner*—Richard A. Rosenberger
*Attorney, Agent, or Firm*—David H. Jaffer

[57] ABSTRACT

An integrated emission microscope with an emitted radiation detection system for collecting and analyzing radiation from a device under test. A semi-ellipsoidal mirror of high ellipticity directs emitted radiation from the device under test through an aperture to a radiation guide, Which transmits the radiation to spectral analyzer. The device under test may be mounted on a scanning stage. The system permits high spatial resolution selected area spectroscopic analysis, panchromatic imaging, and spectroscopic mapping of the emitted radiation from the device under test.

16 Claims, 3 Drawing Sheets

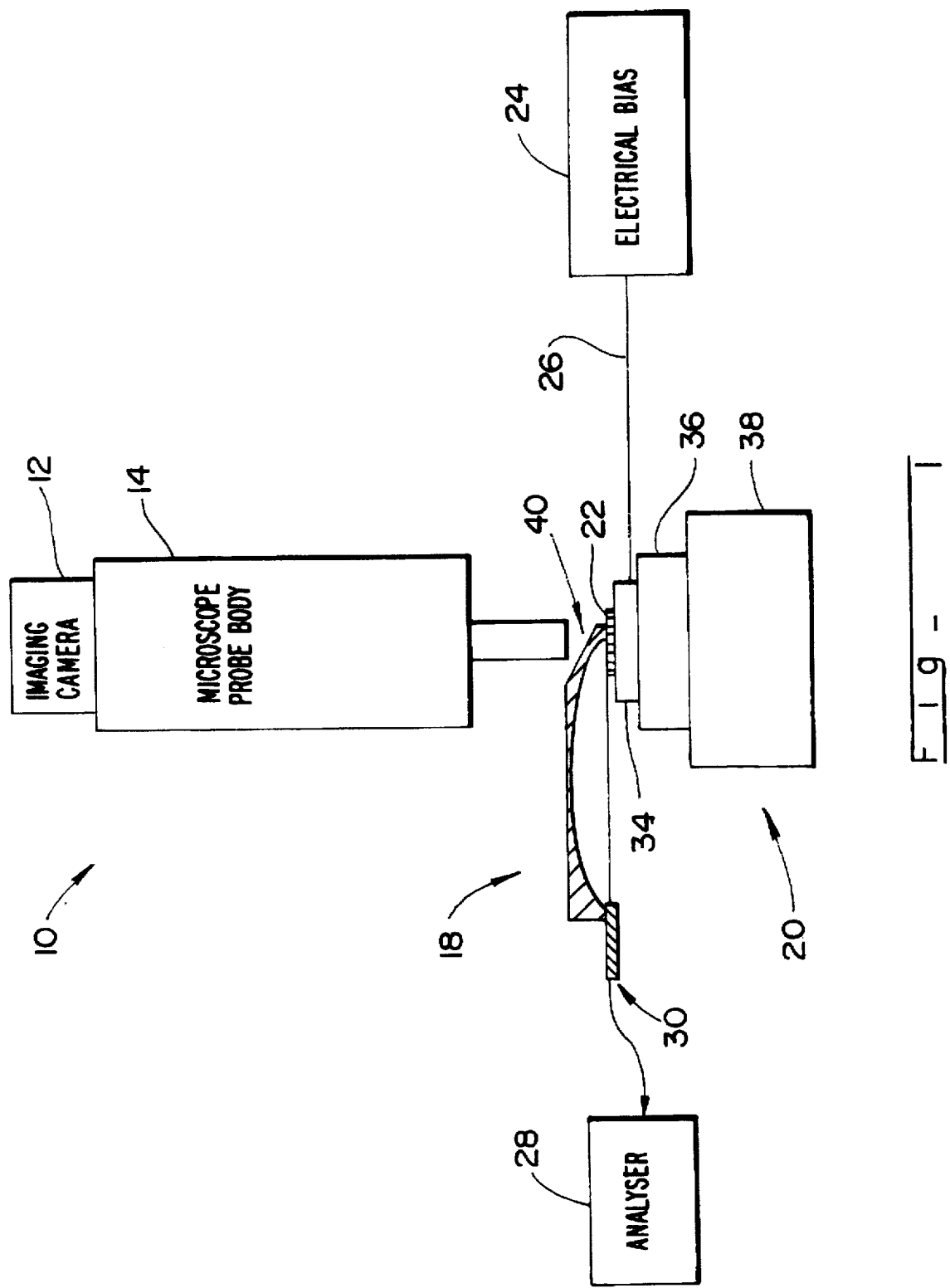

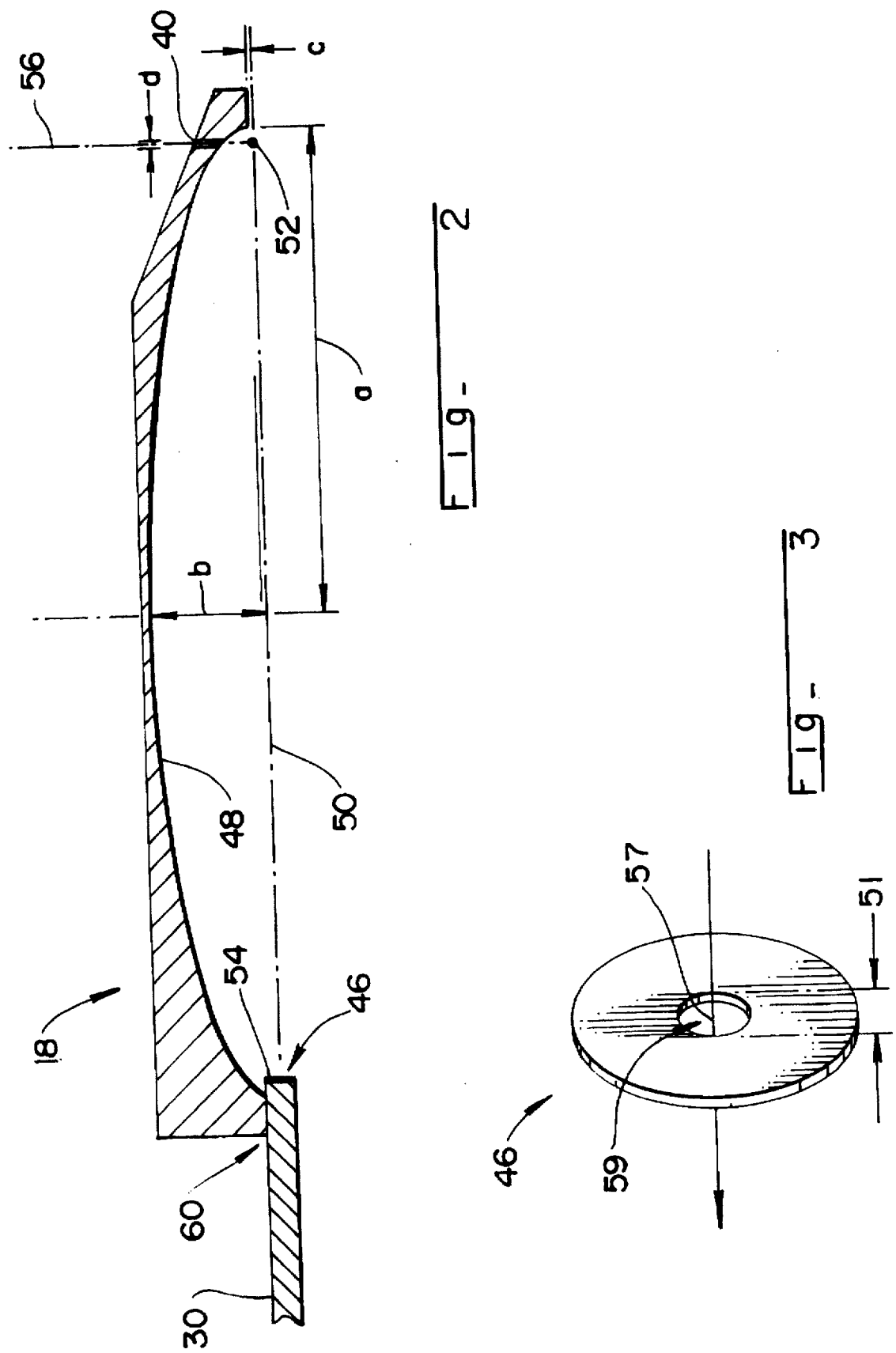

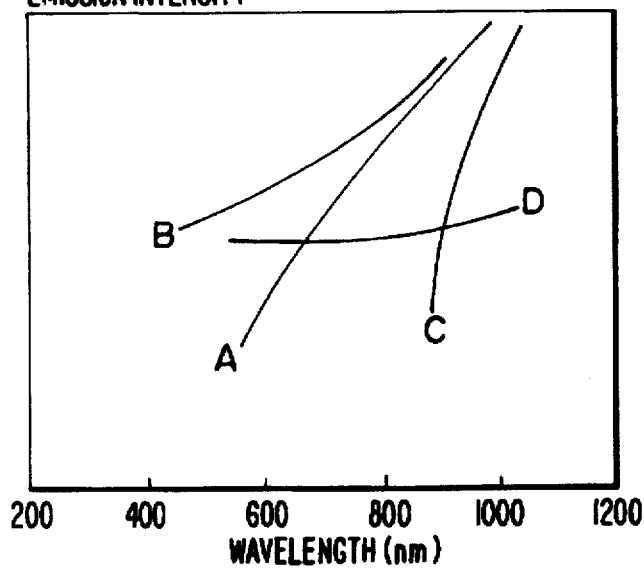
Fig- 4
A = Saturated MOSFETS: HOT Electrons
B = MOSFETs in Avalanche Breakdown
C = CMOS Latch-up
D = Oxide Breakdown
Fig- 5
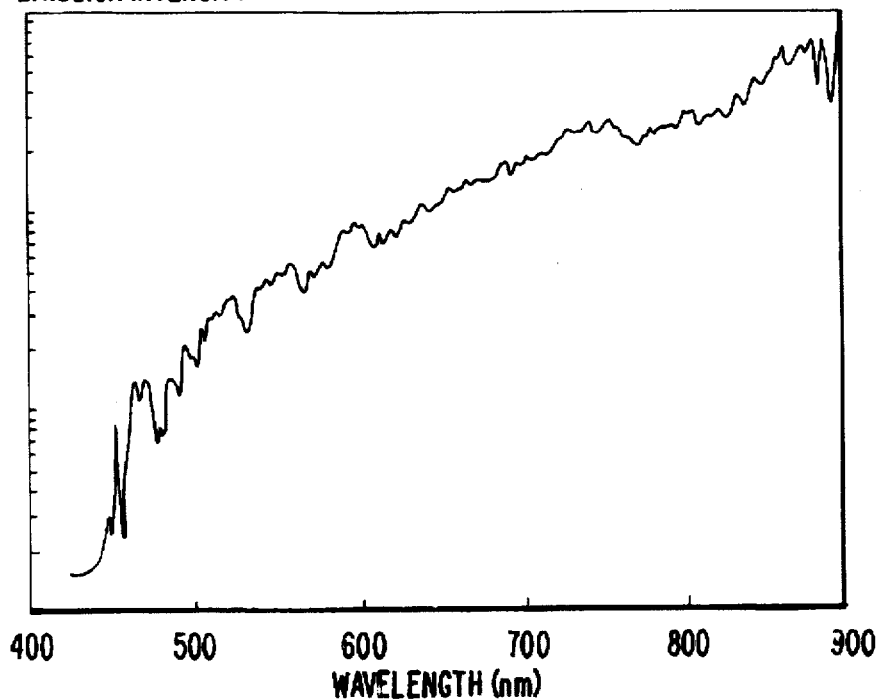

INTEGRATED EMISSION MICROSCOPE FOR PANCHROMATIC IMAGING, CONTINUOUS WAVELENGTH SPECTROSCOPY AND SELECTIVE AREA SPECTROSCOPIC MAPPING

This is a continuation-in-part of application Ser. No. 08/490,352 filed on Jun. 14, 1995, now U.S. Pat. No. 5,569,920, issued Oct. 29, 1996.

FIELD OF THE INVENTION

The invention relates generally to an emission microscope incorporating an emitted radiation detection apparatus, providing high spectral and spatial resolution. More particularly, the invention deals with the use of an ellipsoidal mirror in conjunction with an aperture and radiation guide for collecting and passing emitted radiation to a wavelength selector and radiation sensitive detector, allowing continuous wavelength detection of emissions from a device under test (such as a semiconductor integrated circuit) with high spectral resolution, and providing high efficiency, high spatial resolution panchromatic imaging and spectroscopic mapping of emissions. The device has extremely high sensitivity due to its high collection, high optical coupling and high transmission efficiencies.

BACKGROUND OF THE INVENTION

Some semiconductor integrated circuits, when connected to an electrical source, emit radiation from certain surface locations. This phenomenon is still being investigated and its physical mechanism has not been fully understood, although numerous possible mechanisms have been proposed. While good quantitative measurement techniques have not been available, currently available apparatus and techniques have been used to make qualitative measurements of these emissions for aiding in failure analysis and reliability studies.

The equipment for making qualitative measurements has included various types of sensitive radiation detectors, such as charge-coupled devices (CCD) and image intensifiers. These devices, when attached to a conventional optical microscope, form an emission microscope capable of detecting emitted radiation and are normally suitable for imaging in panchromatic mode, which is the formation of an image using all the wavelengths of emitted radiation within the detection range of the instrument. In current practice, when such a system is used for more sophisticated studies that involve extracting spectral information, discrete radiation filters are inserted in the radiation path. This results in an ineffective system since numerous filters have to be inserted and replaced in sequence for obtaining a range of spectral response, and the band passed by a filter is relatively wide. Furthermore, after filtering off the unwanted wavelengths, the desired wavelength may be severely attenuated. In addition, the collection efficiencies of conventional optical and emission microscopes are relatively poor, resulting in inefficient spectroscopic detection.

Besides spectral resolution, the limitations on spatial resolution of conventional optical and emission microscopes have discouraged their use in imaging of very small features. Limitations of currently available emission microscopes are described below.

The emission microscope system disclosed in U.S. Pat. No. 4,680,635 has the disadvantage of being unable to perform spectral analysis work. A similar system was disclosed in U.S. Pat. No. 4,811,090 incorporating a noise reduction algorithm for improving image quality in noisy situations. European Patent Application No. 0 510 887 A2 utilized an emission microscope of the same type but with the addition of a means for analyzing defective portions of semiconductor devices. This apparatus suffers from poor collection efficiency. U.S. Pat. No. 4,755,874 relates to a system similar to those mentioned above, but with better means of locating defects on the device under test.

Systems incorporating discrete filters into an emission microscope for obtaining spectral information are described in "Quantitative Emission Microscopy", J. Kölzer, et al., *J. Appl. Phys.* 71(11), 1 Jun. 1992, p. R23; "New Detection Method of Hot-Carrier Degradation Using Photon Spectrum Analysis of Weak Luminescence on CMOS VLSI", N. Tsutu et al , Proc. IEEE 1990 Int Conference on Microelectronic Test Structure, Vol. 3, March 1990, p. 143; and "Advanced Method of Failure Analysis Using Photon Spectrum of Emission Microscopy", H. Ishizuka et al., *Proceeding of The International Symposium For Testing and Failure Analysis*, 1990, p. 13.

Another system reported in "Luminescence spectra of an n-channel metal-oxide-semiconductor field-effect transistor at breakdown", N. C. Das et al., *Appl. Phys. Lett.* 56 (12), 19 Mar. 1990, p. 1152, has the problem of inflexibility associated with it. The system uses a monochromator for continuous wavelength selection, but requires the device under test to be mounted close to the entrance of the monochromator. A photomultiplier is attached at the monochromator output as a radiation detector. This arrangement results in a bulky unit, and spectral work has to be performed outside the conventional optical microscope imaging path.

In conclusion, an efficient emission microscope system with the capability of providing spectral analysis with high spectral and spatial resolution does not exist.

SUMMARY OF THE INVENTION

It is, therefore, an object of the present invention to provide an emitted radiation detection system capable of highly efficient light collection and transmission to a radiation sensitive detector, thereby allowing high spectral and spatial resolution;

It is another object of the present invention to provide an emitted radiation detection system having high radiation detection sensitivity, useful in resolving and analyzing very weak emissions from selected small areas;

It is a further object of the present invention to provide an emitted radiation detection system having the capability of both high spectral resolution and continuous wavelength capability;

It is a still further object of the present invention to provide an emitted radiation detection system providing the capability of analyzing large devices; and It is another object of the present invention to provide an emitted radiation detection system having an emitted radiation detector that can be removed from and inserted into the viewing path of an optical or emission microscope.

Briefly, the preferred embodiment of the present invention includes a radiation detection system for collecting and measuring radiation from a device under test. The system includes a semi-ellipsoidal mirror of high ellipticity with first and second focal points. The area of the device to be inspected is first identified with an optical microscope or a conventional emission microscope, with the specific area of emission to be inspected positioned at the first focal point of the mirror. The mirror very efficiently directs emitted radiation from the device under test to the second focal point, from which a radiation guide passes the collected emitted radiation to a spectral analyzer. An aperture may be used before the radiation guide to enhance spatial resolution.

IN THE DRAWING

FIG. 1 is a block diagram showing the various components of the emitted radiation detection system of the present invention;

FIG. 2 is a cross sectional view showing further detail of the semi-ellipsoidal mirror, aperture and radiation guide;

FIG. 3 is an expanded, detailed view of the aperture;

FIG. 4 illustrates characteristic emission spectra for various semiconductor integrated circuit device defects; and FIG. 5 shows an emission spectrum from an emission spot from a failed semiconductor device, indicating hot-electron effects.

DETAILED DESCRIPTION OF THE PREFERRED EMBODIMENT

The disclosure of U.S. patent application Ser. No. 08/490,352 for "Retractable Cathodoluminescence Detector with High Ellipticity and High Backscattered Electron Rejector Performance for Large Area Specimens" is incorporated herein by reference.

The present invention integrates a mirror of the semi-ellipsoidal shape described in application Ser. No. 08/490,352 with a conventional optical microscope or emission microscope and a scanning stage. An aperture is preferably used before the radiation guide. The resultant system is capable of panchromatic imaging, continuous wavelength spectroscopy, and selective area spectroscopic mapping. As a consequence of the optimized collection, coupling and transmission efficiencies achieved by the present invention, high radiation detection sensitivity is achieved, which is useful in resolving very weak emitted radiation. Spectroscopic analysis can now be performed at higher spectral resolution with continuous wavelength capability, which is not obtainable in conventional emission microscope set-ups. When an aperture is incorporated at the second focal point of the mirror, and the device under test is mounted on a high resolution scanning stage, high spatial resolution selected area spectroscopic analysis, panchromatic imaging, as well as spectroscopic mapping of the emitted radiation from the device under test may be attained.

FIG. 1 shows a diagram of a preferred embodiment of the present invention. An optical/emission microscope 10, with an imaging camera 12 and microscope probe body 14, is used for viewing a device under test (DUT) 22. A positioning apparatus 20 locates DUT 22 relative to the optical/emission microscope and a collector 18. A hole 40 in collector 18 allows direct viewing of DUT 22 through microscope 10 while collector 18 is in place. Collector 18 directs emitted radiation from DUT 22 to a radiation guide 30, which transmits the radiation to radiation analyzer 28. Electrical bias to DUT 22 is provided by module 24 through interconnections 26. Positioning apparatus 20 includes a device holder 34 for mounting DUT 22, and a high resolution scanning stage 36 in conjunction with a low resolution positioning stage 38, which provide controlled positioning of the device under test.

Operation of the system involves mounting DUT 22 on holder 34. DUT 22 is positioned and brought into focus of the optical/emission microscope 10, through aperture 40 in collector 18. Once the optical image is in focus, an electrical bias is applied to DUT 22 by way of supply 24 and interconnection 26. A particular point emission of interest may then be identified through imaging camera 12 of the optical/emission microscope 10. The point emission of interest is then positioned at the focal point 52 of collector 18 to optimize collection efficiency (as described below). Note that the embodiment of FIGS. 1 and 2 shows a collector 18 with an aperture 40 for use of an optical/emission microscope while the collector is positioned over DUT 22. Alternatively, a collector without an aperture may be used: DUT 22 is positioned with positioning apparatus 20 after the emission point of interest is identified with microscope 10, and then collector 18 is moved into position over DUT 22.

Once the emission point of interest is positioned beneath collector 18, the collector guides emitted radiation from the point of interest to optical guide 30 (preferably an optical fiber) which transmits the collected radiation to radiation analyzer 28. Analyzer 28 is usually a spectral type and normally includes a wavelength selector such as a monochromator, and a radiation sensitive detector such as a photomultiplier tube. Alternately, analyzer 28 can be a panchromatic detector.

The high efficiency of the collector design of the present invention allows detection and spectroscopic mapping of very weak emissions. Emission microscopes of the prior art collect on the order of 5% of emitted radiation. The design of the present invention captures on the order of 85% of emitted radiation. This high efficiency permits more precise and much faster emission characterization (e.g., an emission spectrum may be gathered in five minutes, instead of several hours as previously required).

A concave mirror is used as the collector, preferably having semi-ellipsoidal shape with a high ellipticity. This provides high collection efficiency, as well as compatibility with large sized test devices (from the long cross section). A further advantage of the high ellipticity of mirror 18 is the resulting low height structure which allows mirror 18 to be inserted between optical/emission microscope 10 and DUT 40. Efficient transmission of radiation requires that radiation collected by the mirror be confined within a cone with an angle less than a critical value. In order to accomplish this, it has been found that a semi-ellipsoidal mirror of high ellipticity is preferred. In particular, with ellipticity "e" defined as:

$$e^2 = 1 - b^2/a^2$$

where "a" is the major semiaxis and "b" the minor semiaxis of the ellipse, an ellipticity "e" greater than 0.8 is preferred. Radiation emitted from a first focal point of the ellipse is focused by the mirror at the second focal point. The collection of radiation from the second focal point is accomplished with emission collection means (preferably a radiation guide such as an optical fiber leading to a remote emission analyzer). The face of the emission collection means is positioned at the second focal point of the mirror, and aligned such that the face of the emission collection means is centered upon and substantially perpendicular to the axis connecting the focal points of the mirror. This advantageous arrangement gives the detector both spectroscopic and imaging capabilities without losing collection and transmission efficiencies.

FIG. 2 shows further detail of the radiation collection system, including concave collector mirror 18, radiation guide 30, and aperture 46. Mirror 18 has a highly reflective surface 48 preferably of ellipsoidal shape, the figure showing a longitudinal cross section view. Mirror surface 48 is preferably a semi-ellipsoid (a 180° rotational cross section around axis 50 joining first and second ellipse focal points 52 and 54). The major semiaxis of the mirror is identified by the length "a" and the minor semiaxis of the mirror is identified by the length "b". In the preferred embodiment, a is approximately 61 mm and b is approximately 13 mm. With these dimensions, a is compatible with large area specimens and b fits with the required working distance of conventional optical and/or emission microscopes. As an alternate embodiment, the mirror is also functional if constructed to be less than a full semi-ellipsoid. For example, a quarter ellipsoid including the half of the semi-ellipsoid on the side of the first focal point 52 in FIG. 2 would be functional to focus a large percentage of emitted radiation from the first focal point 52 to the second focal point 54. The use of less than a full semi-ellipsoid, however, will result in a reduction in collection efficiency (which is critical in the case of weak emissions).

Radiation guide 30 is preferably an optical fiber or optical fiber bundle with a diameter of approximately 3 mm. The face of guide 30 is located at focal point 54 of mirror 18. The point of interest on DUT 22 (see FIG. 1) is positioned at focal point 52 of mirror 18. Above focal point 52, a cylindrical hole 40 with diameter d is opened to provide optical access for viewing with an optical/emission microscope along line 56. Diameter d is typically on the order of 1 mm.

DUT 22 is preferably positioned with its surface in line with the axis 50, and below the mirror at an elevation "c" (typically 1 mm). A small portion may be removed from the bottom of the semiellipsoidal mirror 18 to obtain elevation "c", required in order to allow the surface of a DUT 22 to move along the axis 50. A relief 60 is required at the other end of mirror 42 for radiation guide 44.

As noted above, the center of the emission collection means, preferably radiation guide 30, is sited on second focal point 54 with the collection face substantially perpendicular to the axis connecting focal points 52 and 54. Aperture 46 is centered just before second focal point 54, and serves to select out an area of emission resulting in spectral analysis with a high degree of spatial resolution. High collection efficiency is achieved by ensuring that the equivalent numerical aperture or the F number of mirror 18 is matched to the effective numerical aperture or F number of the radiation guide 30 and wavelength selector system (spectral analyzer). Aperture 46 limits aberration effects at the second focal point 54 due to off focus emission from near first focal point 52 of the mirror 18. When a point of emission is away from first focal point 52, there is a much larger deviation of the reflected radiation from second focal point 54. If an aperture 46 such as in FIG. 3 with an appropriate diameter 51 is placed in front of radiation guide 30 with its center 57 aligned with second focal point 54, only radiation from an emission point close to the first focal point 52 will be detected while other off focus emissions will be blocked. The size of the required opening 59 of an aperture 46 is significantly larger than the emission area being resolved. In other words, even if a big spot or area is emitting radiation, it can be resolved spatially to the required resolution, depending on the size of the aperture 46 and opening 59 used.

Thus, when DUT 22 emits radiation at first focal point 52, the radiation is reflected from mirror surface 48 to second focal point 54. Aperture 46 spatially restricts the radiation reaching radiation guide 30. Use of the aperture and high resolution scanning stage 36 permit high spatial resolution selected area spectroscopic analysis, panchromatic imaging, and spectroscopic mapping of the emitted radiation from DUT 22.

An alternate embodiment for accomplishing a measurement of total emitted light (panchromatic imaging) is achieved by simply replacing radiation guide 30 and spectral analyzer 28 with a radiation sensitive detector at second focal point 54. The collected radiation in such a case will be higher than in spectroscopic analysis since the total radiation from all detectable wavelengths will be measured.

FIG. 4 illustrates the characteristic spectra for various semiconductor IC failure mechanisms. As is apparent from FIG. 4, the ability to characterize an emission spectrum may permit a failure mechanism to be identified. Once such identification is made, the IC manufacturing process can be modified to eliminate the failure. FIG. 5 is an emission spectrum from an emission spot of a failed IC device obtained with the system of the present invention. The emission spectrum indicates hot electron effects (compare FIG. 5 with Curve A of FIG. 4).

Mirror 18 has successfully been fabricated by the procedure described below. Plastic polymers are well-suited because they are easily molded. Examples of such polymers are polymethylmethacrylate (PMMA) and Araldite. The mirror can be fabricated using a plastic molding technique. A convex mold of the required semi-ellipsoidal shape is machined using a computer-controlled lathe. The mold is then polished to mirror finish so that no further polishing is required for the surface of the concave mirror molded out in this way. A plastic material in moldable form is used to cast out the desired substance from the mold. The concave surface is then made reflective by evaporation of a thin layer of a highly reflective material, such as aluminum.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An emission microscope system for collecting and analyzing light emitted from an emission point of interest on a device under test, comprising:
   (a) a concave ellipsoidal mirror with an ellipticity greater than 0.8, the mirror having first and second focal points;
   (b) means for positioning the emission point of interest at the first focal point; and
   (c) emission collection means located at the second focal point of the mirror, said collection means having a collection face centered upon and substantially perpendicular to the axis connecting the first and second focal points, whereby emissions from the emission point of interest are focused to the second focal point and collected by said collection means.

2. The system of claim 1, wherein the collection means comprises a radiation guide which collects emissions at the second focal point and transmits the emissions to remote detection means.

3. The system of claim 2, wherein the remote detection means comprises wavelength selection means and a radiation sensitive detector.

4. The system of claim 2, further comprising an aperture located adjacent to the collection face of the collection means, said aperture centered upon and substantially perpendicular to the axis connecting the first and second focal points, whereby said aperture blocks off focus emission from near the first focal point before it reaches said collection face.

5. The system of claim 1, wherein said mirror is a semi-ellipsoid.

6. The system of claim 5, wherein the collection means comprises a radiation guide which collects emissions at the second focal point and transmits the emissions to remote detection means.

7. The system of claim 6, wherein the remote detection means comprises wavelength selection means and a radiation sensitive detector.

8. The system of claim 7, further comprising an aperture located adjacent to the collection face of the collection means, said aperture centered upon and substantially perpendicular to the axis connecting the first and second focal points, whereby said aperture blocks off focus emission from near the first focal point before it reaches said collection face.

9. An integrated emission microscope system for collecting and analyzing light emitted from an emission point of interest on a device under test, comprising:

(a) first stage optical/emission microscope system for positioning identifying an emission point of interest on a device under test;

(b) a concave ellipsoidal mirror with an ellipticity greater than 0.8, the mirror having first and second focal points;

(c) means for positioning the emission point of interest at the first focal point of the mirror; and (d) emission collection means located at the second focal point of the mirror, said collection means having a collection face centered upon and substantially perpendicular to the axis connecting the first and second focal points, whereby emissions from the emission point of interest are focused to the second focal point and collected by said collection means.

10. The system of claim 9, wherein the collection means comprises a radiation guide which collects emissions at the second focal point and transmits the emissions to remote detection means.

11. The system of claim 10, wherein the remote detection means comprises wavelength selection means and a radiation sensitive detector.

12. The system of claim 10, further comprising an aperture located adjacent to the collection face of the collection means, said aperture centered upon and substantially perpendicular to the axis connecting the first and second focal points, whereby said aperture blocks off focus emission from near the first focal point before it reaches said collection face.

13. The system of claim 9, wherein said mirror is a semi-ellipsoid.

14. The system of claim 13, wherein the collection means comprises a radiation guide which collects emissions at the second focal point and transmits the emissions to remote detection means.

15. The system of claim 14, wherein the remote detection means comprises wavelength selection means and a radiation sensitive detector.

16. The system of claim 14, further comprising an aperture located adjacent to the collection face of the collection means, said aperture centered upon and substantially perpendicular to the axis connecting the first and second focal points, whereby said aperture blocks off focus emission from near the first focal point before it reaches said collection face.

* * * * *